United States Patent
Yin et al.

(10) Patent No.: US 11,388,356 B1
(45) Date of Patent: Jul. 12, 2022

(54) AI FUSION PIXEL SENSOR USING MEMRISTORS

(71) Applicant: TETRAMEM INC., Newark, CA (US)

(72) Inventors: Wenbo Yin, Newark, CA (US); Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 0 days.

(21) Appl. No.: 17/228,079

(22) Filed: Apr. 12, 2021

(51) Int. Cl.
| | |
|---|---|
| H04N 5/351 | (2011.01) |
| H04N 5/3745 | (2011.01) |
| H04N 5/378 | (2011.01) |
| G06F 7/544 | (2006.01) |
| H01L 45/00 | (2006.01) |

(52) U.S. Cl.
CPC ........... *H04N 5/351* (2013.01); *G06F 7/5443* (2013.01); *H04N 5/378* (2013.01); *H04N 5/37455* (2013.01); *H01L 45/04* (2013.01)

(58) Field of Classification Search
CPC ......... H04N 5/351–3559; H04N 5/369; H04N 5/374–37457; H04N 5/378; G06F 7/544; G06F 7/5443; H01L 45/04
See application file for complete search history.

(56) References Cited

U.S. PATENT DOCUMENTS

2019/0035154 A1* 1/2019 Liu ..................... G06K 9/6268
2021/0264973 A1* 8/2021 Jaiswal .............. G11C 13/0038

OTHER PUBLICATIONS

Arthurs: Ashwani Kumar, Mukul Sarkar, & Manan Suri (Indian Institute of Technology); Title: Exploiting OxRAM Resistive Switching for Dynamic Range Improvement of CMOS Image Sensors; Published Date: May 5, 2017; pp. 1-6, Figures 1a & 3a. (Year: 2017).*

Arthurs: Kamilya Smagulova, Aigerim Tankimanova & Alex Pappachen James (Bioinspired Microelectronics Systems Group, School of Engineering, Nazarbayev University, Astana); Title: CMOS-Memristor Hybrid Integrated Pixel Sensors; Published Date: Oct. 15, 2016; pp. 1-3, Figures 4 & 5. (Year: 2016).*

* cited by examiner

*Primary Examiner* — Timothy J Henn
*Assistant Examiner* — Akshay Trehan
(74) *Attorney, Agent, or Firm* — Jaffery Watson Mendonsa & Hamilton LLP

(57) ABSTRACT

Technologies relating to AI fusion pixel sensor for MLP using active pixel sensors with memristors are disclosed. An example apparatus includes: many of active pixel sensors, wherein each active pixel sensors includes: a photodiode configured to receive image signal; a transfer gate; a selector controller; a reset controller; a voltage readout end; a first 1T1R cell, a second 1T1R cell, and a third 1T1R cell connected to the voltage readout end; and a first current readout end, a second current readout end, and a third current readout end connected to the first 1T1R cell, the second 1T1R cell, and the third 1T1R cell respectively; a first total current readout end, a second total current readout end, and a third total current readout end, whose total current equals the sum of the currents of all current readout ends in each active pixel sensors.

15 Claims, 9 Drawing Sheets

8000

AI FUSION PIXEL SENSOR USING MEMRISTORS

TECHNICAL FIELD

The present disclosure relates generally to AI fusion pixel sensor using memristors and more particularly to AI fusion pixel sensor for MLP using active pixel sensor with memristors.

BACKGROUND

Many systems include imaging devices to sense and capture optical images that can be electronically converted to a digital representation of the image. Image sensors include an array of photo-sensitive devices such as photodiodes or photo-transistors fabricated on, for example, a complementary metal-oxide-semiconductor (CMOS) device. Each photo-sensitive device is sensitive to light in such a way that it can create an electrical charge that is proportional to the intensity of light striking the photo-sensitive device. The overall image captured by an image sensor includes many pixels arranged in an array such that each pixel detects the light intensity at the location of that pixel.

Imaging devices formed according to a conventional CMOS process are known as a CMOS imager and may be configured to include active pixel sensors (APS). An active pixel sensor (APS) includes an integrated circuit containing an array of pixels, each containing a photodetector (e.g., photodiode or other similar devices) as well as other transistors for resetting and gating the stored charge on the photodetectors. In a conventional CMOS imager, each pixel cell in an array of pixels operates to convert light intensity to electrical charge, accumulate the electrical charge in proportion to the light intensity, and transfer the accumulated charge to an amplifier. In many CMOS imagers, a pixel may be reset to a specific reference voltage level prior to, or after, acquiring the image.

An RRAM is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) and a Low-Resistance State (LRS). The switching event from an FIRS to an LRS is often referred to as a "Set" or "On" switch; the switching systems from an LRS to an FIRS is often referred to as a "Reset" or "Off" switching process.

Multilayer Perceptron (MLP) is an artificial neural network commonly used in many AI applications, such as image processing, video processing, machine learning, and natural language processing. It is a neural network connecting multiple layers in a directed graph, which means that the signal path through the nodes only goes one way. Each node, apart from the input nodes, has a nonlinear activation function. Since there are multiple layers of neurons, MLP is a deep learning technique. In the MLP, it is commonly adopted as a classifier—determining whether the vector of inputs belong to one or more classes. It generally gives a probability of which class the input belongs to. For instance, one can adapt training classifiers to recognize 5 categories of clothing from low-resolution images in the MLP.

Conventional MLP requires using algorithms to construct and train the MLP class object for classification tasks. In the present disclosure, a new architecture using a CMOS image sensor with a memristor-based crossbar array may realize a hardware classifier for MLP.

SUMMARY

Technologies relating to AI fusion pixel sensor for MLP using active pixel sensors with memristors are disclosed.

An example apparatus, in some implementations, includes: many of active pixel sensors, wherein each active pixel sensors includes: a photodiode configured to receive image signal; a transfer gate; a selector controller; a reset controller; a voltage readout end; a first 1T1R cell, a second 1T1R cell, and a third 1T1R cell connected to the voltage readout end; and a first current readout end, a second current readout end, and a third current readout end connected to the first 1T1R cell, the second 1T1R cell, and the third 1T1R cell respectively; a first total current readout end, whose total current equals the sum of the currents of the first current readout end in each active pixel sensors; a second total current readout end, whose total current equals the sum of the currents of the second current readout end in each active pixel sensors; and a third total current readout end, whose total current equals the sum of the currents of the third current readout end in each active pixel sensors.

In some implementations, the transfer gate is configured to control the photodiode, the selector controller is configured to control the current to the voltage readout end, and the reset controller is configured to reset the image signal received.

In some implementations, the apparatus is configured to work as a classifier.

In some implementations, the apparatus is configured to perform analog dot product.

In some implementations, each of the first 1T1R cell, the second 1T1R cell, and the third 1T1R cell includes a transistor and a memristor.

The apparatus, in some implementations, further includes a first voltage driver and a second voltage driver, wherein the first voltage driver and the second voltage driver are configured to set or reset the first 1T1R cell, the second 1T1R cell, and the third 1T1R cell.

The apparatus, in some implementations, further includes: a column decoder connected to the active pixel sensors; a row decoder connected to the active pixel sensors; a column amplifier connected to the first total current end, the second total current end, and the third total current end; a multiplexer connected to the column amplifier; an ADC connected to the multiplexer; and a memory connected to the ADC.

An apparatus, in some implementations, includes: an active pixel sensor including: a photodiode configured to receive image signal; a transfer gate; a selector controller; a reset controller; a voltage readout end; a first transistor; a second transistor; a third transistor; a fourth transistor; a first voltage driver; and a second voltage driver; and a memristor-based crossbar array connected to the active pixel sensor via the voltage readout end.

In some implementations, the first voltage driver is connected to the first transistor; the selector controller is connected to a gate of the second transistor; the reset controller is connected to a gate of the third transistor; the photodiode is connected to a source of the fourth transistor; the transfer gate controller is connected to a gate of the fourth transistor; and the second voltage driver is connected to the voltage readout end.

In some implementations, the first transistor is configured to provide amplification of the image signal received from the photodiode; the second transistor is configured to control current to the voltage readout end; the third transistor is configured to reset signal; and the fourth transistor is configured to control signals transferring from the photodiode.

In some implementations, the memristor-based crossbar array includes many 1T1R cells.

In some implementations, the first voltage driver and the second voltage driver are configured to set or reset the 1T1R cells.

In some implementations, the first voltage driver and the second voltage driver are configured to set or reset the 1T1R cells.

In some implementations, when in a set mode, a voltage of the first voltage driver is higher than a voltage of the second voltage driver; when in a reset mode, the voltage of the first voltage driver is lower than the voltage of the second voltage driver.

In some implementations, the apparatus is configured to perform analog dot product.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to AI fusion pixel sensor for MLP using active pixel sensors with memristors are disclosed.

The technologies described in the present disclosure may provide the following technical advantages.

First, the disclosed technologies integrate an active pixel sensor with memristors, the AI fusion pixel sensor can perform analog dot product. It demonstrates the feasibility of the analog accumulation during the operation of AI mode. This allows the AI fusion pixel sensor to accumulate light signals received by the photodiodes and generate analog dot product results via the memristor-based crossbar arrays.

Second, by applying two voltage drivers in the AI fusion pixel sensor, the memristors may be turned ON/OFF during the operation of the SET/RESET mode. Therefore, the network can be trained or reprogrammed during different stages of in-memory computation.

Third, the disclosed technologies may work as a classifier under the MLP neural network. This allows the AI fusion pixel sensor to classify image signals received into predetermined categories, which provides a promising approach for making time and energy-efficient, deep learning inference hardware, especially for image recognition applications.

Figure 1B:
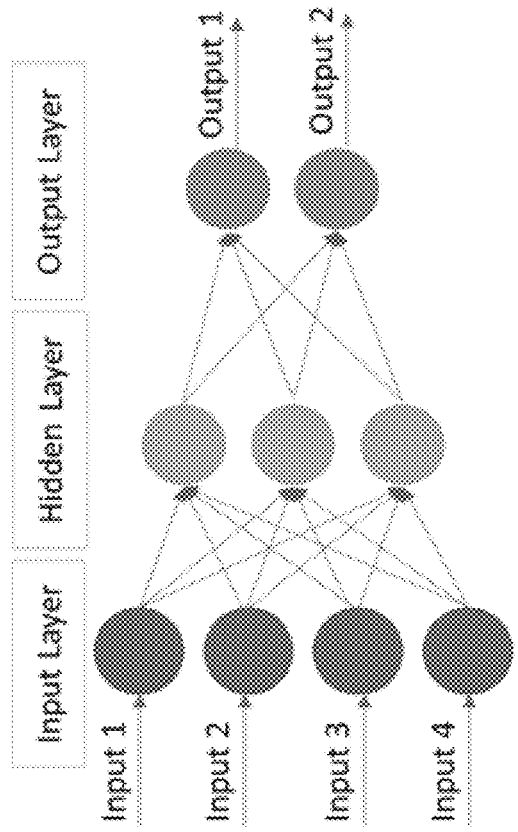
FIGS. 1A and 1B are block diagrams illustrating architectures of an MLP without a hidden layer and an MLP with one hidden layer.
Figure 1A:
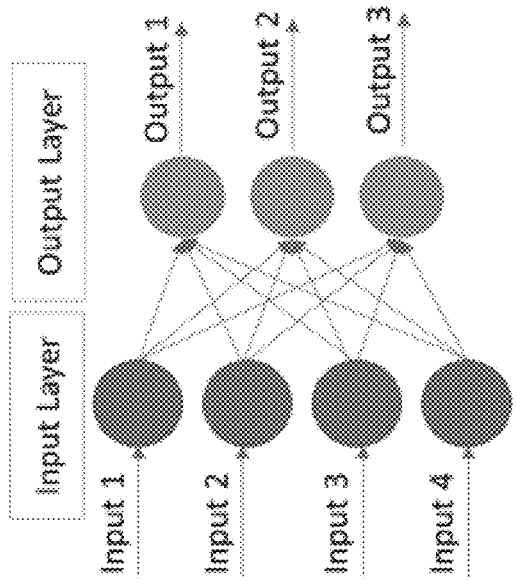

FIGS. 1A and 1B are block diagrams illustrating architectures of an MLP without a hidden layer and an MLP with one hidden layer. As mentioned above, MLP is an artificial neural network commonly used in many AI applications, such as image processing, video processing, machine learning, and natural language processing. It is commonly adopted as a classifier—determining whether the vector of inputs belong to one or more classes. It generally gives a probability of which class the input belongs to. This classifier may be used in image recognition techniques. For instance, a user may train the MLP classifier with three classes: cat, dog, and rabbit. And then, the neural network may classify all the images it received into three classes. Conventional MLP requires using software algorithms to construct and train the MLP class object for classification tasks. In the present disclosure, a new architecture using a CMOS image sensor with memristors may realize a hardware classifier for MLP. FIG. 1A is an example of MLP with no hidden layer. FIG. 2A is an example of MLP with one hidden layer. Both MLP can be realized by using or combining implementations of the present disclosure.

Figure 2:
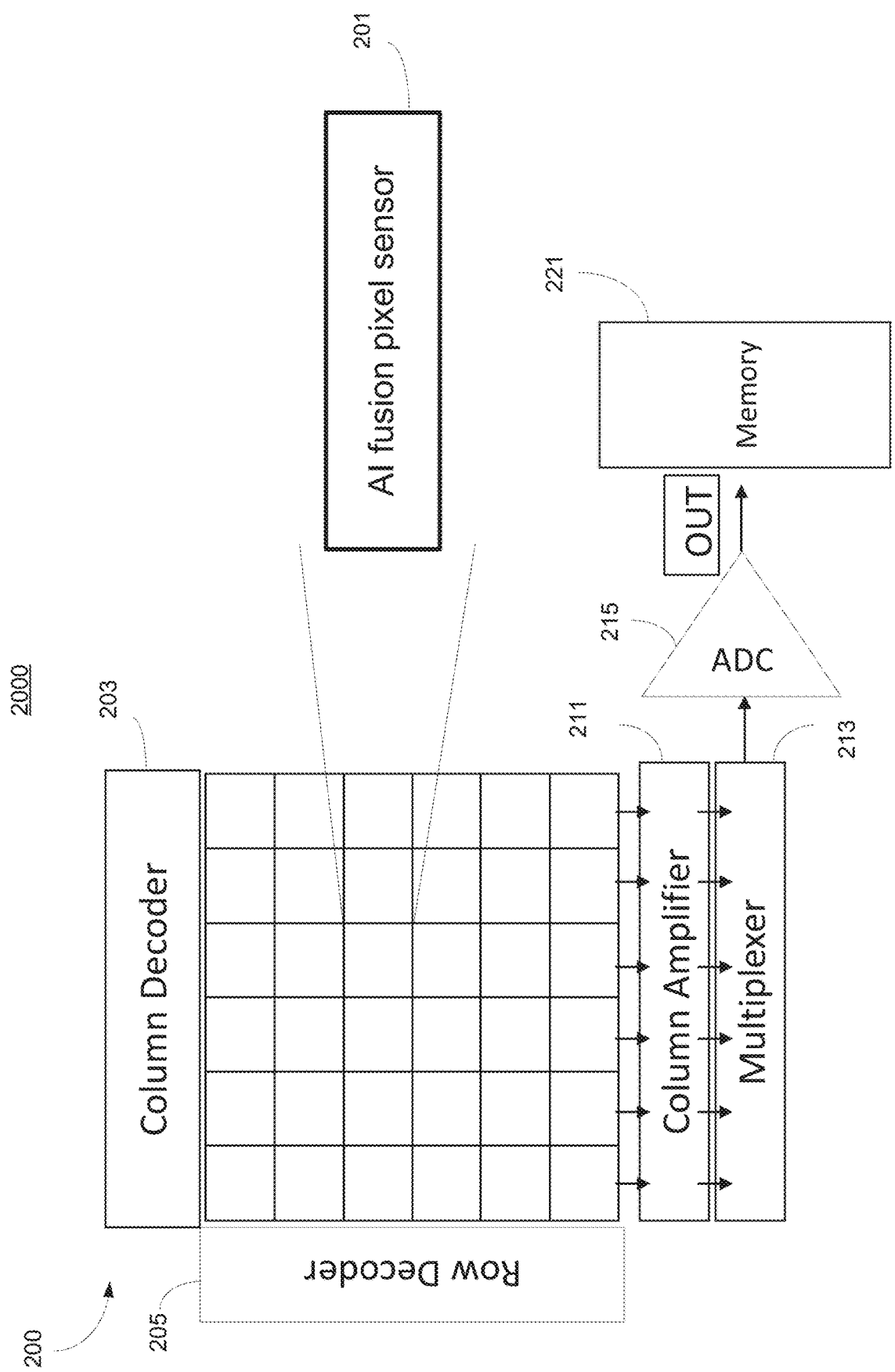
FIG. 2 is a block diagram illustrating a CMOS image sensor-based circuit in accordance with some implementations of the present disclosure.

FIG. 2 is a block diagram 2000 illustrating a CMOS image sensor-based circuit 200 in accordance with some implementations of the present disclosure.

As shown in FIG. 2, the CMOS image sensor-based circuit 200 includes one or many of CMOS image sensors 201 (e.g., AI fusion pixel sensors) configured to receive image or light signals, a column decoder 203 configured to select the pixels in columns to read out, a row decoder 205 configured to select the pixels in rows to read out, an amplifier 211 (i.e., a column amplifier) configured to amplify signals from the CMOS image sensors 201, a multiplexer 213 (i.e., a time-division multiplexer) configured to sequentially or serially readout signals from the amplifier 211, an ADC 215 configured to convert signals from the amplifier 211 from analog to digital, and a digital-based memory 221 configured to store the signals from the ADC 215.

When light injects on the CMOS image sensor 201, the CMOS image sensor collects data only from those selected rows and columns. The signal (usually in a voltage form) is then amplified by the amplifier 211. And then, the multiplexer 213 sequentially or serially readout signals and send them to the ADC 215. The ADC 215 converts signals from analog form to digital form so that the digital signals may be stored in the digital-based memory 221. The digital signals may be processed or accessed by a Central Processing Unit (CPU) or other processors. The CMOS image sensor 201 here, including an active pixel sensor, is engineered to be implemented as an MLP classifier.

It is noted that in order to run MLP properly, the row decoder needs to be able to turn on multiple rows at the same time, to achieve a vector dot-product effect. Furthermore, in order to perform SET/REST on the memristor, the VDD of the image sensor (or Vrst) may be adjustable, requiring a global DAC. Meanwhile, in order to perform SET/RESET on the memristors, there needs to be a driver for the memristor output node, which will be discussed later. Finally, since VMM is a collection of information of multiple pixels, the result has a much greater dynamic range than a single pixel. Therefore, the resolution or dynamic range of the ADC may need to be adjusted.

Figure 3:
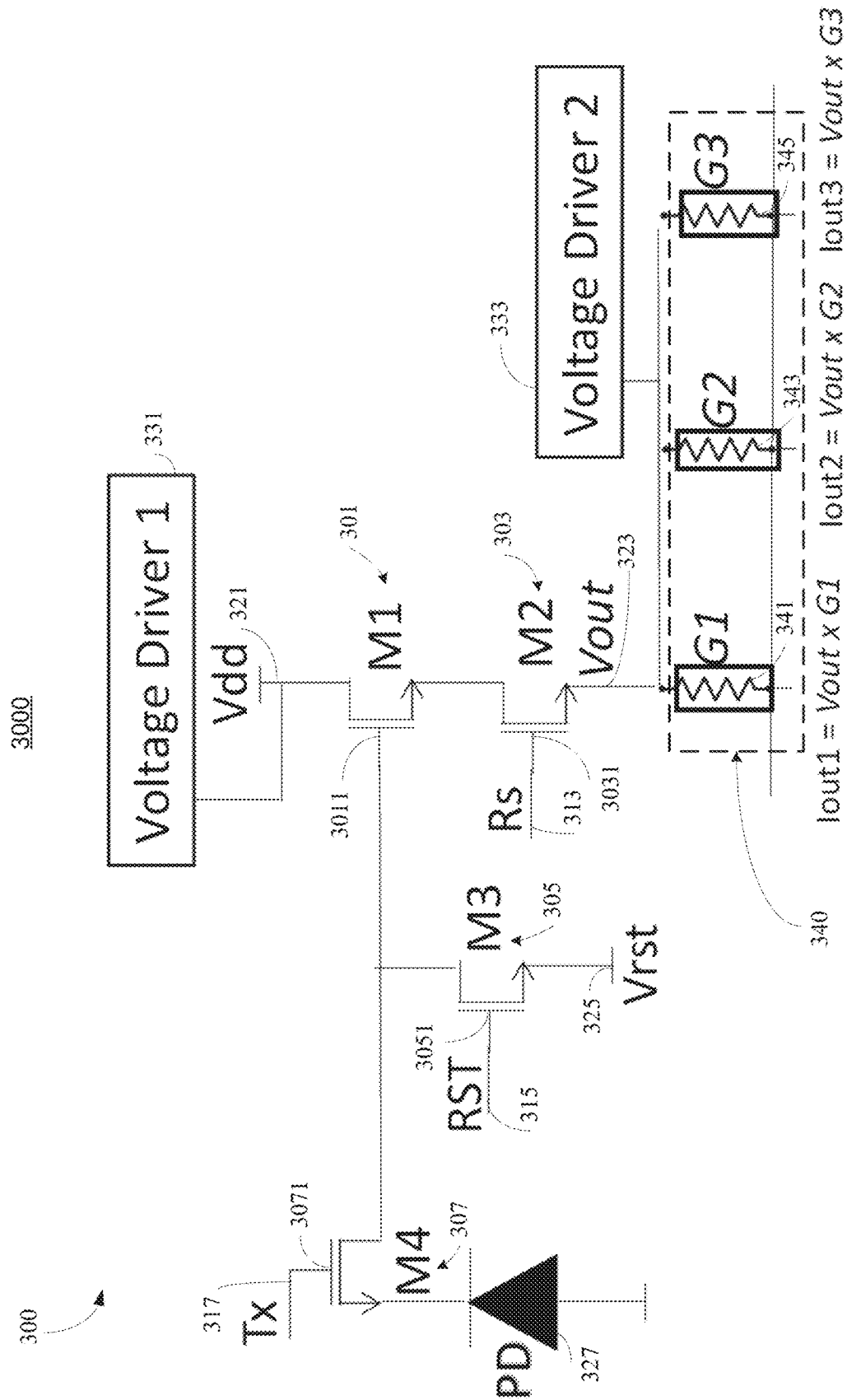
FIG. 3 is a block diagram illustrating an AI fusion active pixel sensor in accordance with some implementations of the present disclosure.

FIG. 3 is a block diagram 3000 illustrating an AI fusion active pixel sensor 300 in accordance with some implementations of the present disclosure. It is noted that AI fusion here means that it can merge data from multiple sensors, from sensors under different filters or classifications, or from sensors with different weight, to achieve an outcome that far exceeds using each sensor individually.

As shown in FIG. 3, the AI fusion active pixel sensor 300 includes an active pixel sensor and a memristor-based crossbar array. The active pixel sensor includes a first transistor 301, a second transistor 303, a third transistor 305, and a fourth transistor 307.

The first transistor 301 is connected to a first voltage driver 331 which supplies a drain voltage Vdd 321, a voltage source for amplification. In some implementations, the first transistor 301 is configured to provide amplification of the signal received from the photodiode by sourcing an enhanced current.

The second transistor 303 including a drain connected to a source of the first transistor 301. A selector controller (Rs) 313 is connected to a gate of the second transistor 303 and controls the current to the output where a voltage Vout 323 is determined. In some implementations, the second transistor 303 is configured to turn on and off the current to the output.

The third transistor 305 is connected to a gate 3011 of the first transistor 301 via its drain. A reset controller (RST) 315 is connected to a gate of the third transistor 305, and a reset voltage source (Vrst) 325 is connected to a source of the third transistor 305. The third transistor 305 including the Rst 315 and the Vrst 325 are for resetting. To be specific, the Rst 315 is configured to turn on and off to reset the signal accumulated in the gate 3011 of the first transistor 301, where the gate 3011 is a readout node. In some implementations, the third transistor 305 is configured to reset the signal accumulated in the gate 3011 of the first transistor 301 of the last cycle.

The fourth transistor 307 is connected to the gate of the first transistor 301 and also the drain of the third transistor 305 via its drain. A photodiode 327 is connected to a source of the fourth transistor 307. A transfer gate controller Tx 317 is connected to a gate 3071 of the fourth transistor 307 and is configured to control the photodiode 327. To be specific, the photodiode 327 is drained by activating the Tx gate 317, and the photodiode signal is transferred to the readout node which is the gate 3011 of the first transistor 301. In some implementations, the fourth transistor 307 is configured to control signals transferring from the photodiode 327.

Besides the active pixel sensor mentioned above, the present disclosure further includes a distinct design of the memristor-based crossbar array in the output end.

As shown in FIG. 3, the AI fusion active pixel sensor 300 includes the memristor-based crossbar array 340. The memristor-based crossbar array 340 includes one or many of 1T1R cell including a first 1T1R cell 341, a second 1T1R cell 343, and a third 1T1R cell 345 connected in parallel. The memristor-based crossbar array 340 is connected to the output voltage Vout 323 of the active pixel sensor. Meanwhile, a second voltage driver 333 is connected to the output voltage Vout 323. The second voltage driver 333 is configured to set or reset the memristors of the memristor-based crossbar array 340 by applying a positive or negative voltage across the memristors. By adding the 1T1R cell with tunable resistance or conductance circuit, the analog dot product on the pixel sensor can be realized. For instance, the first 1T1R cell 341 includes a first memristor with conductance G1, the second 1T1R cell 343 includes a second memristor with conductance G2, and the third 1T1R cell 345 includes a third memristor with conductance G3. The output currents Iout1, Iout2, and Iout3 are Vout×G1, Vout×G2, and Vout×G3, respectively. By doing so, users may program the G1, G2, and G3 in advance before receiving signals from the photodiode. With the weight setting up, once the image signal is transferred in, the image signal can be weighted or classified by multiply the pre-determined or pre-programmed G1, G2, and G3. This provides an excellent analog solution to realize MLP using pixel sensors with a memristor-based crossbar circuit.

Figure 4:
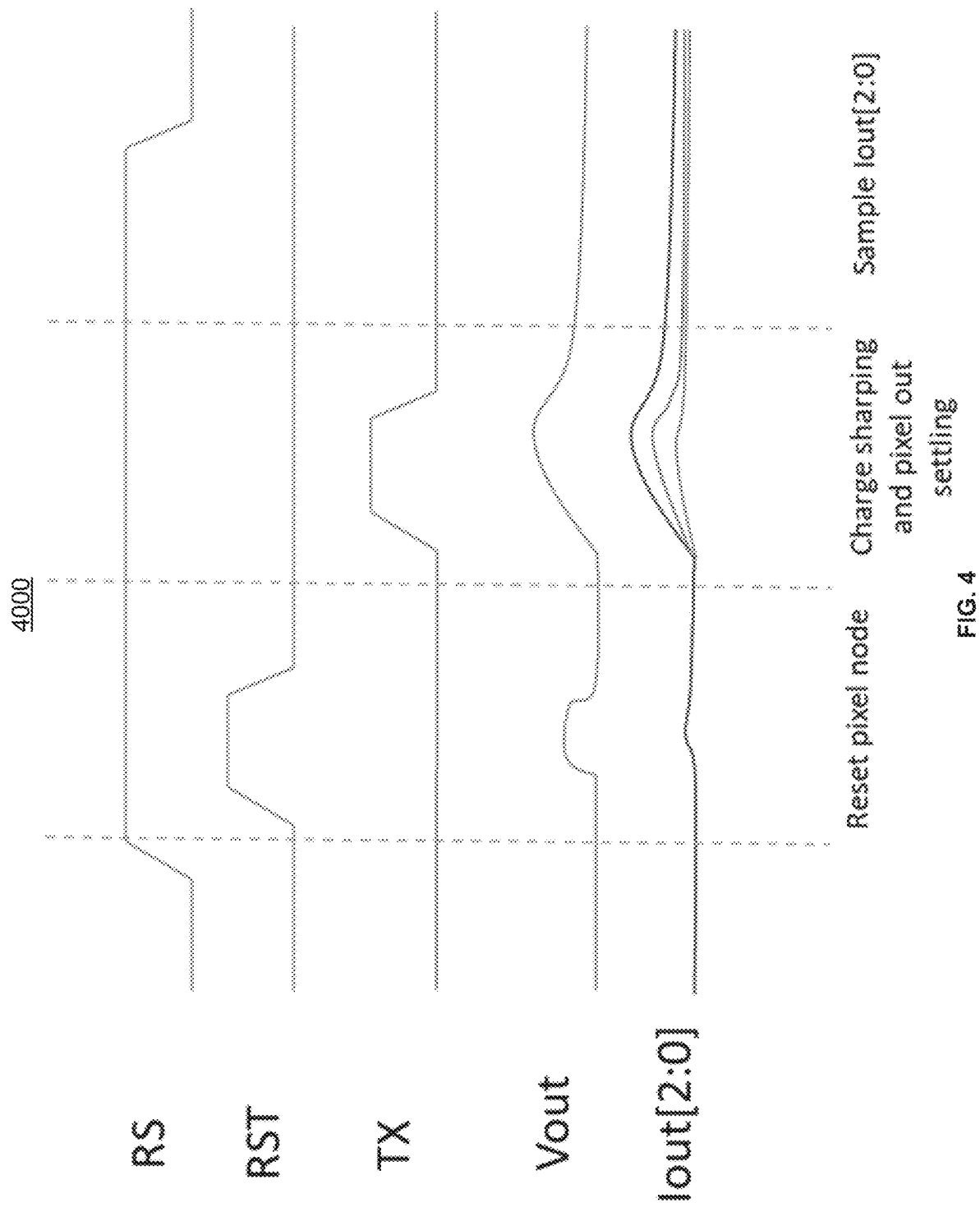
FIG. 4 is a timing diagram illustrating an operation of AI fusion pixel sensor under AI mode in accordance with some implementations of the present disclosure.

FIG. 4 is a timing diagram 4000 illustrating an operation of AI fusion pixel sensor under AI mode in accordance with some implementations of the present disclosure. In the beginning, the selector controller (Rs) 313 is turned on, and an RST pulse is triggered and resets the readout signal of the last cycle. When resetting, a small voltage pump will be read out at Vout and Iout. Next, activate the Tx gate 317, and the photodiode signal is transferred to the readout node. Since the image signal is accumulating, the Vout and Iout will increase over time until the Tx is off. Iout [2:0] means the Iout2, Iout1, and Iout0. Since the conductance G in three memristors are different, the readout currents are different.

Figure 5:
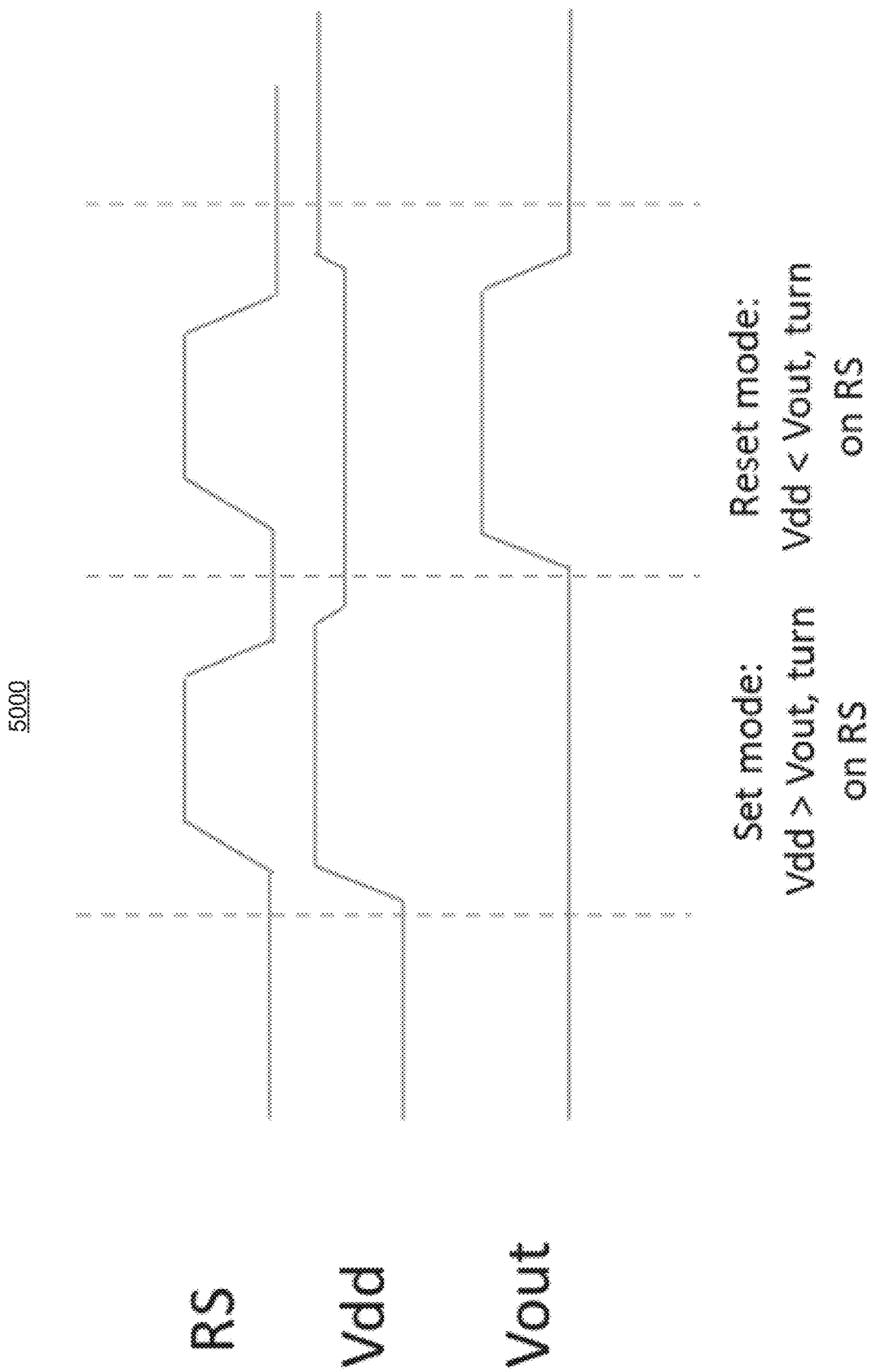
FIG. 5 is a timing diagram illustrating an operation of AI fusion pixel sensor under memristor SET/RESET mode in accordance with some implementations of the present disclosure.

FIG. 5 is a timing diagram 5000 illustrating an operation of AI fusion pixel sensor under memristor SET/RESET mode in accordance with some implementations of the present disclosure. As mentioned above, to program the memristor with different conductances, a first voltage driver 331 and the second voltage driver 333 are used to setting and resetting the memristors. During the SET/RESET mode, the Rs is turned on. At set mode, the Vdd is set to be larger than Vout so that the current will positively flow through the memristors to switch them to LRS or On state. In contrast, at reset mode, the Vdd is set to be smaller than Vout so that the current will negatively flow through the memristors to switch them to HRS or Off state.

Figure 6:
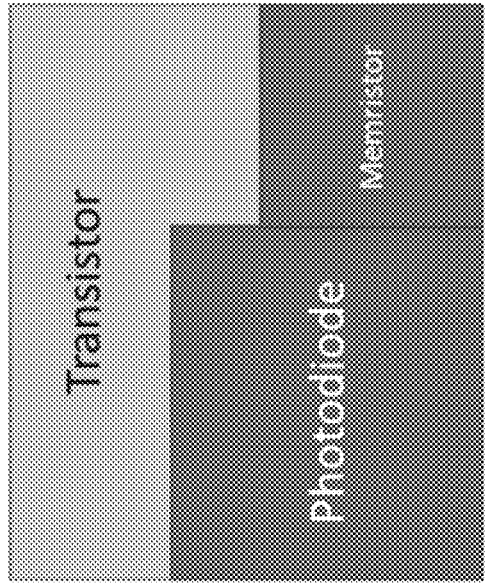
FIG. 6 is a schematic layout diagram illustrating an overall AI fusion pixel sensor layout with additional memristors and transistors.
Figure 6:
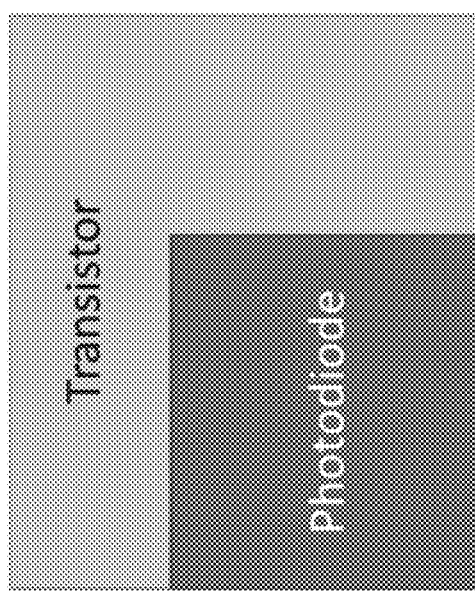

FIG. 6 is a schematic layout diagram 6000 illustrating an overall AI fusion pixel sensor layout with additional memristors and transistors. By adding memristors in the pixel sensor, It may increase the pixel size slightly.

Figures 7A, 7B:
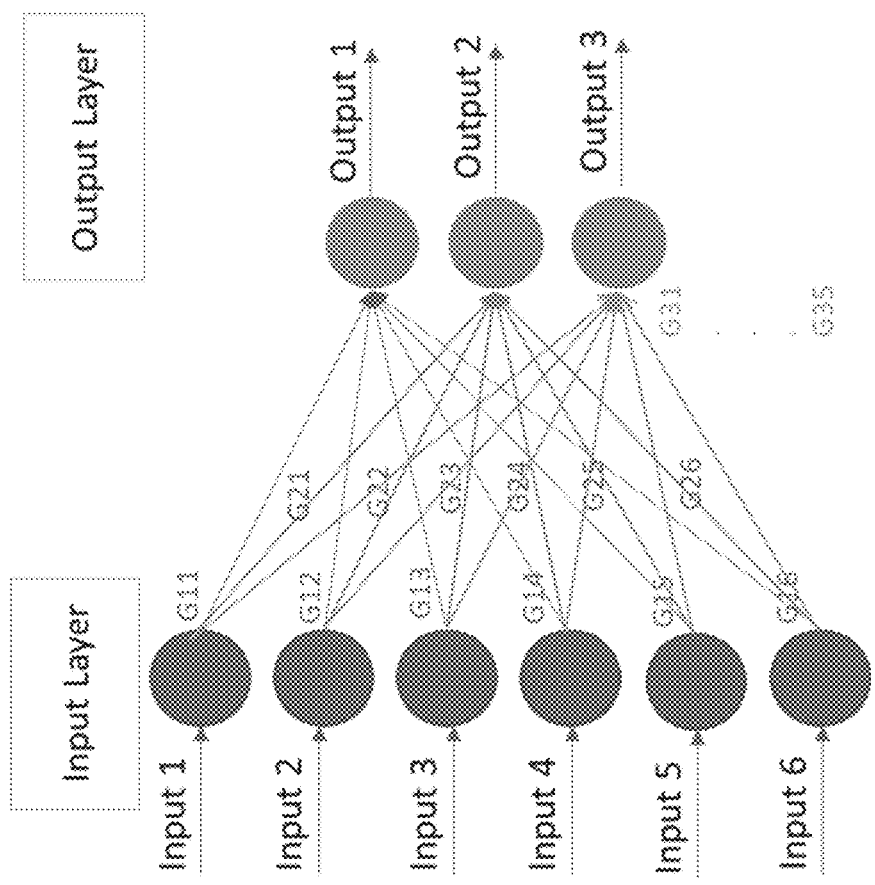
FIG. 7A is a block diagram illustrating architectures of an MLP without a hidden layer under the operation of the AI fusion pixel sensor by having three memristors with conductances G1, G2, and G3.
FIG. 7B is a formula illustrating the sum of the dot product of the Iout1, Iout2, and Iout3 when receiving six Vout signals—V1 to V6, which represent six image signals received from the photodiodes.

FIG. 7A is a block diagram 7000 illustrating architectures of an MLP without hidden layer under the operation of the AI fusion pixel sensor by having three memristors with conductances G1, G2, and G3.

FIG. 7B is a formula 7100 illustrating the sum of the dot product of the Iout1, Iout2, and Iout3 when receiving six Vout signals—V1 to V6, which represent six image signals received from the photodiodes. Therefore, the AI fusion pixel sensor is configured to classify five images into three categories, and thus MLP is realized.

Figure 8:
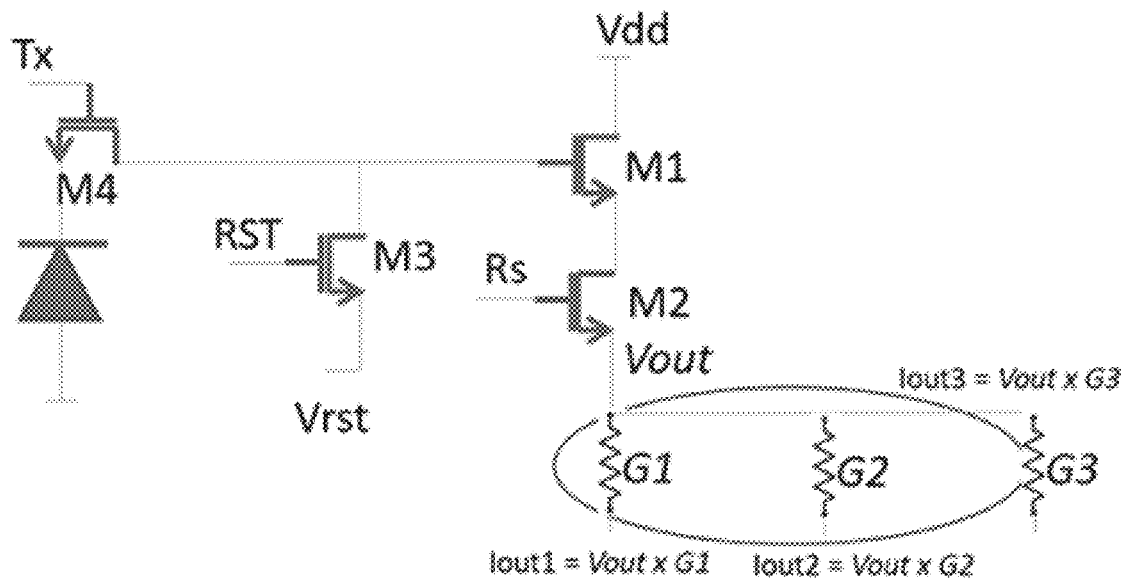
FIG. 8 is a schematic diagram illustrating a modularized AI fusion pixel sensor in accordance with some implementations of the present disclosure.
Figure 8:
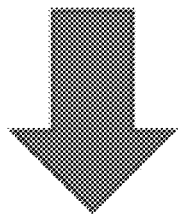
Figure 8:
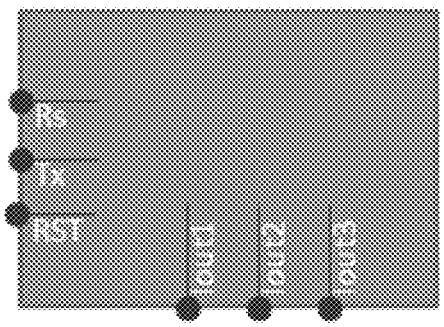

FIG. 8 is a schematic diagram 8000 illustrating a modularized AI fusion pixel sensor in accordance with some implementations of the present disclosure.

Figure 9:
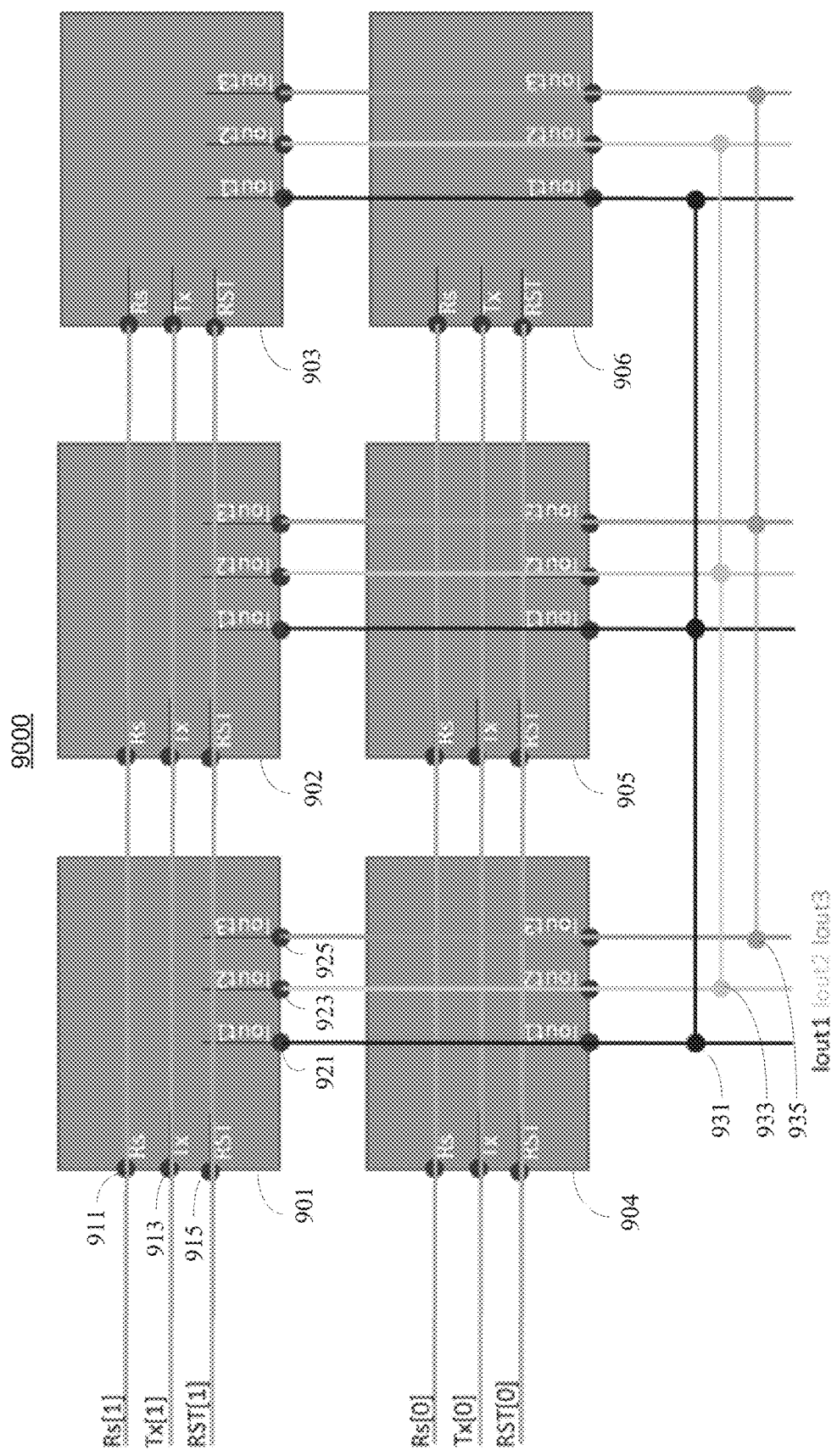
FIG. 9 is a schematic diagram illustrating a modularized AI fusion pixel sensor as a 3-class classifier in accordance with some implementations of the present disclosure.

FIG. 9 is a schematic diagram 9000 illustrating a modularized AI fusion pixel sensor as a 3-class classifier in accordance with some implementations of the present disclosure. As shown in FIG. 9, since there are six input image signals transferred by six transfer gates Tx and three output signals Iout1, Iout2, and Iout3, the overall Iout equals to six Iout from six crossbars of six pixels. It, therefore, realizes the classifier in a modularized implementation.

As shown in FIG. 9, there are many active pixel sensors 901-906. Each active pixel sensors includes: a photodiode (not shown, it may be the same photodiode 327 as shown in FIG. 3); a transfer gate 913; a selector controller 911; a reset controller 915; a voltage readout end (not shown, it may be the same voltage readout end 323 as shown in FIG. 3); a first 1T1R cell (not shown, it may be the same 1T1R cell 341 as shown in FIG. 3), a second 1T1R cell (not shown, it may be the same 1T1R cell 343 as shown in FIG. 3), and a third 1T1R cell (not shown, it may be the same 1T1R cell 345 as shown in FIG. 3) connected to the voltage readout end; and a first current readout end 921, a second current readout end 923, and a third current readout end 925 connected to the first 1T1R cell, the second 1T1R cell, and the third 1T1R cell respectively; a first total current readout end 931, whose total current equals the sum of the currents of the first current readout end in each active pixel sensors; a second total current readout end 933, whose total current equals the sum of the currents of the second current readout end in each active pixel sensors; and a third total current readout end 935, whose total current equals the sum of the currents of the third current readout end in each active pixel sensors. Therefore, an analog MLP classifier using the active pixel sensors with memristors is formed.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:
1. An apparatus, comprising:
 a plurality of active pixel sensors, wherein each active pixel sensors comprise:
  a photodiode configured to receive image signal;
  a transfer gate;
  a selector controller;
  a reset controller;
  a voltage readout end;
  a first 1T1R cell, a second 1T1R cell, and a third 1T1R cell connected to the voltage readout end; and
  a first current readout end, a second current readout end, and a third current readout end connected to the first 1T1R cell, the second 1T1R cell, and the third 1T1R cell respectively;
 a first total current readout end, whose total current equals the sum of the currents of the first current readout end in each active pixel sensors;
 a second total current readout end, whose total current equals the sum of the currents of the second current readout end in each active pixel sensors; and a third total current readout end, whose total current equals the sum of the currents of the third current readout end in each active pixel sensor.

2. The apparatus as claimed in claim 1, wherein the transfer gate is configured to control the photodiode, the selector controller is configured to control the current to the voltage readout end, and the reset controller is configured to reset the image signal received.

3. The apparatus as claimed in claim 1, wherein the apparatus is configured to work as a classifier.

4. The apparatus as claimed in claim 1, wherein the apparatus is configured to perform analog dot product.

5. The apparatus as claimed in claim 1, wherein each of the first 1T1R cell, the second 1T1R cell, and the third 1T1R cell comprises a transistor and a memristor.

6. The apparatus as claimed in claim 1, further comprises a first voltage driver and a second voltage driver, wherein the first voltage driver and the second voltage driver are configured to set or reset the first 1T1R cell, the second 1T1R cell, and the third 1T1R cell.

7. The apparatus as claimed in claim 1, further comprises:
a column decoder connected to the active pixel sensors;
a row decoder connected to the active pixel sensors;
a column amplifier connected to the first total current end, the second total current end, and the third total current end;
a multiplexer connected to the column amplifier;
an ADC connected to the multiplexer; and
a memory connected to the ADC.

8. An apparatus, comprising:
an active pixel sensor comprising:
a photodiode configured to receive image signal;
a transfer gate;
a selector controller;
a reset controller;
a voltage readout end;
a first transistor;
a second transistor;
a third transistor;
a fourth transistor;
a first voltage driver; and
a second voltage driver; and
a memristor-based crossbar array connected to the active pixel sensor via the voltage readout end.

9. The apparatus as claimed in claim 8, wherein
the first voltage driver is connected to the first transistor;
the selector controller is connected to a gate of the second transistor;
the reset controller is connected to a gate of the third transistor;
the photodiode is connected to a source of the fourth transistor;
the transfer gate controller is connected to a gate of the fourth transistor; and
the second voltage driver is connected to the voltage readout end.

10. The apparatus as claimed in claim 8, wherein
the first transistor is configured to provide amplification of the image signal received from the photodiode;
the second transistor is configured to control the current to the voltage readout end;
the third transistor is configured to reset signal; and
the fourth transistor is configured to control signals transferring from the photodiode.

11. The apparatus as claimed in claim 8, wherein the memristor-based crossbar array comprises a plurality of 1T1R cells.

12. The apparatus as claimed in claim 11, wherein the first voltage driver and the second voltage driver are configured to set or reset the 1T1R cells.

13. The apparatus as claimed in claim 12, wherein the first voltage driver and the second voltage driver are configured to set or reset the 1T1R cells.

14. The apparatus as claimed in claim 13, wherein when in a set mode, a voltage of the first voltage driver is higher than a voltage of the second voltage driver; when in a reset mode, the voltage of the first voltage driver is lower than the voltage of the second voltage driver.

15. The apparatus as claimed in claim 8, wherein the apparatus is configured to perform analog dot product.

* * * * *